(12) United States Patent
Woolsey

(10) Patent No.: US 11,605,576 B2
(45) Date of Patent: Mar. 14, 2023

(54) VIA FOR SEMICONDUCTOR DEVICES AND RELATED METHODS

(71) Applicant: SEMICONDUCTOR COMPONENTS INDUSTRIES, LLC, Phoenix, AZ (US)

(72) Inventor: Eric Jeffery Woolsey, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 54 days.

(21) Appl. No.: 16/451,510

(22) Filed: Jun. 25, 2019

(65) Prior Publication Data
US 2020/0411412 A1 Dec. 31, 2020

(51) Int. Cl.
*H01L 23/48* (2006.01)
*H01L 21/768* (2006.01)
*H01L 23/00* (2006.01)
*H01L 21/02* (2006.01)

(52) U.S. Cl.
CPC ...... *H01L 23/481* (2013.01); *H01L 21/02118* (2013.01); *H01L 21/76873* (2013.01); *H01L 21/76877* (2013.01); *H01L 24/08* (2013.01)

(58) Field of Classification Search
None
See application file for complete search history.

(56) References Cited

U.S. PATENT DOCUMENTS

| | | | | |
|---|---|---|---|---|
| 7,105,921 | B2* | 9/2006 | Farnworth | H01L 21/316 257/701 |
| 8,232,626 | B2* | 7/2012 | Tsui | H01L 23/481 174/262 |
| 8,252,628 | B2* | 8/2012 | Nabe | H01L 21/76898 438/106 |
| 8,405,196 | B2* | 3/2013 | Haba | H01L 24/13 257/686 |
| 2001/0045611 | A1* | 11/2001 | Clatanoff | H01L 23/49816 257/449 |
| 2006/0027911 | A1* | 2/2006 | Farnworth | H01L 23/481 257/698 |
| 2007/0205520 | A1* | 9/2007 | Chou | H01L 24/48 257/780 |
| 2008/0007927 | A1* | 1/2008 | Ito | H01L 23/49822 361/764 |
| 2008/0224249 | A1* | 9/2008 | Nabe | H01L 24/16 257/433 |
| 2008/0246136 | A1* | 10/2008 | Haba | H01L 24/13 257/686 |
| 2011/0304026 | A1* | 12/2011 | Tsui | H01L 23/481 257/E21.597 |
| 2014/0306349 | A1* | 10/2014 | Gu | H01L 23/49827 257/774 |

(Continued)

*Primary Examiner* — Telly D Green
(74) *Attorney, Agent, or Firm* — Adam R. Stephenson, LTD.

(57) ABSTRACT

A via for semiconductor devices is disclosed. Implementations of vias for semiconductor devices may include: a semiconductor substrate that includes a first side; a via extending from the first side of the semiconductor substrate to a pad; a polymer layer coupled along an entire sidewall of the via, the polymer layer in direct contact with the pad; and a metal layer directly coupled over the polymer layer and directly coupled with the pad.

20 Claims, 3 Drawing Sheets

(56) References Cited

U.S. PATENT DOCUMENTS

| | | | |
|---|---|---|---|
| 2015/0035146 A1* | 2/2015 | Lin | H01L 24/24 257/738 |
| 2016/0027666 A1* | 1/2016 | Rogers | H01L 21/76825 438/127 |
| 2016/0181212 A1* | 6/2016 | Liu | H01L 24/02 257/621 |
| 2016/0190353 A1* | 6/2016 | Liao | H01L 27/14618 257/432 |
| 2018/0102321 A1* | 4/2018 | Ho | H01L 27/14623 |
| 2018/0122698 A1* | 5/2018 | Zhang | H01L 21/76879 |

* cited by examiner

VIA FOR SEMICONDUCTOR DEVICES AND RELATED METHODS

BACKGROUND

1. Technical Field

Aspects of this document relate generally to semiconductor devices. More specific implementations involve vias formed through a semiconductor substrate.

2. Background

Vias are generally formed through a semiconductor substrate in the context of forming a semiconductor wafer, semiconductor die, or other semiconductor device to create an electrical connection.

SUMMARY

Implementations of vias for semiconductor devices may include: a semiconductor substrate that includes a first side; a via extending from the first side of the semiconductor substrate to a pad; a polymer layer coupled along an entire sidewall of the via, the polymer layer in direct contact with the pad; and a metal layer directly coupled over the polymer layer and directly coupled with the pad.

Implementations of vias for semiconductor devices may include one, all, or any of the following:

The sidewall of the via may be angled less than 85 degrees from a line parallel with a plane formed by the first side of the semiconductor substrate.

An entirety of the metal layer may contact the polymer layer.

The metal layer may be a seed layer.

A second metal layer may be electroplated on the seed layer.

A width of the via may be greater than 200 microns.

The polymer layer may include one of a polyimide, a polybenzoxazole (PBO), or a bisbenzocyclotene (BCB).

An oxide layer may be coupled between the polymer layer and the sidewall of the via.

Implementations of vias for semiconductor devices may include: a semiconductor substrate that includes a first side; a via extending from the first side of the semiconductor substrate to a pad; a polymer layer coupled along a sidewall of the via, the polymer layer in direct contact with the pad; and a metal layer directly coupled over the polymer layer and directly coupled with the pad. The sidewall of the via may be angled less than 85 degrees from a line parallel with a plane formed by the first side of the semiconductor substrate.

Implementations of vias for semiconductor devices may include one, all, or any of the following:

An entirety of the metal layer may contact the polymer layer.

The metal layer may be a seed layer.

A second metal layer may be electroplated on the seed layer.

A width of the via may be greater than 200 microns.

The polymer layer may include one of a polyimide, a polybenzoxazole (PBO), or a bisbenzocyclotene (BCB).

An oxide layer may be coupled between the polymer layer and the sidewall of the via.

Implementations of a method of forming a semiconductor device may include: providing a semiconductor substrate, the semiconductor substrate including a first side; forming a via in the first side of the semiconductor substrate, the via extending from the first side of the semiconductor substrate to a pad; forming a polymer layer along an entire sidewall of the via, the polymer layer in direct contact with the pad; and depositing a metal layer directly over the polymer layer, the metal layer directly coupled with the pad.

Implementations of a method of forming a semiconductor device may include one, all, or any of the following:

The method may include forming a via in the first side of the semiconductor substrate may further include forming the sidewall of the via at an angle less than 85 degrees from a line parallel with a plane formed by the first side of the semiconductor substrate.

The method may include etching the polymer layer prior to depositing the metal layer.

The metal layer may be a seed layer, and the method may further include electroplating a second metal layer on the seed layer.

A width of the via may be greater than 200 microns.

The method may further include forming an oxide layer along an entire side wall of the via prior to forming the polymer layer.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended vias and related methods for semiconductor devices will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such vias for semiconductor devices, and implementing components and methods, consistent with the intended operation and methods.

In forming semiconductor vias, a re-passivation layer may be formed within the vias' structure. This re-passivation layer may then relieve the stress between the substrate material and the metal during thermal cycling, or it may serve to electrically isolate the doped silicon from the materials used in the metallization.

Figure 1:
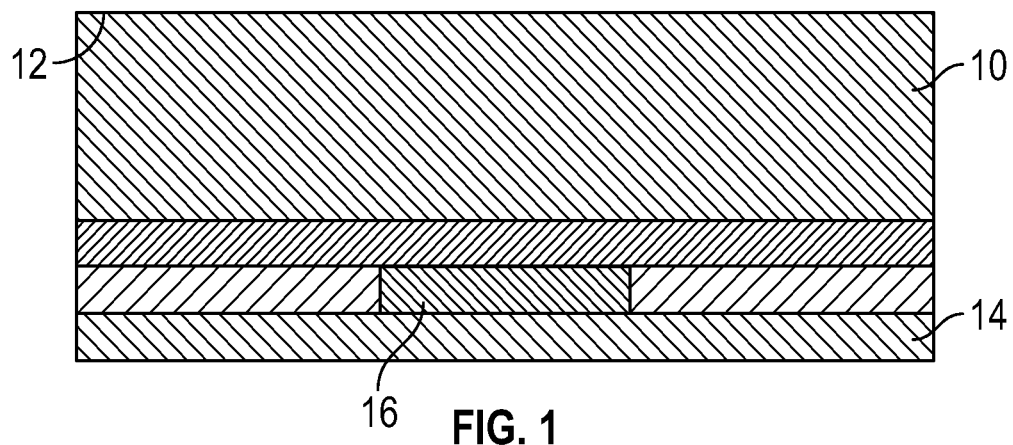
FIG. 1 illustrates an implementation of a semiconductor device with a pad.

Referring to FIG. 1, a cross sectional view of an implementation of a semiconductor device with a pad formed in/on a substrate is illustrated. As illustrated, the substrate 10 is a semiconductor substrate includes a first side 12. As illustrated, the substrate also includes a dielectric layer 14. As illustrated, the dielectric layer 14 is coupled to a pad 16. In various implementations, by non-limiting example, the semiconductor device may be an image sensor chip scale package (CSP), a complementary metal oxide semiconductor (CMOS) image sensor (CIS), metal oxide semiconductor field effect transistor (MOFSET), stacked die package, or any other semiconductor device. In various implementations, the pad 16 may be configured to couple to a semiconductor package, a substrate, a circuit board, or another motherboard. In various implementations, by non-limiting example, the substrate may be formed of, by non-limiting example, glass, ceramic, other electrically insulative materials, silicon, germanium, silicon germanium, graded silicon germanium, silicon carbide, silicon on insulator, glass, sapphire, ruby, gallium arsenide and any other semiconductor substrate or electrically insulative material. In still other implementations, the pad 16 may also be used to couple the die to a resin based substrate such as, by non-limiting example, bismaleimide-triazine (BT), FR-4, laminated substrates, direct bonded copper (DBC) substrates, and any other circuit board or substrate type.

Figure 2:
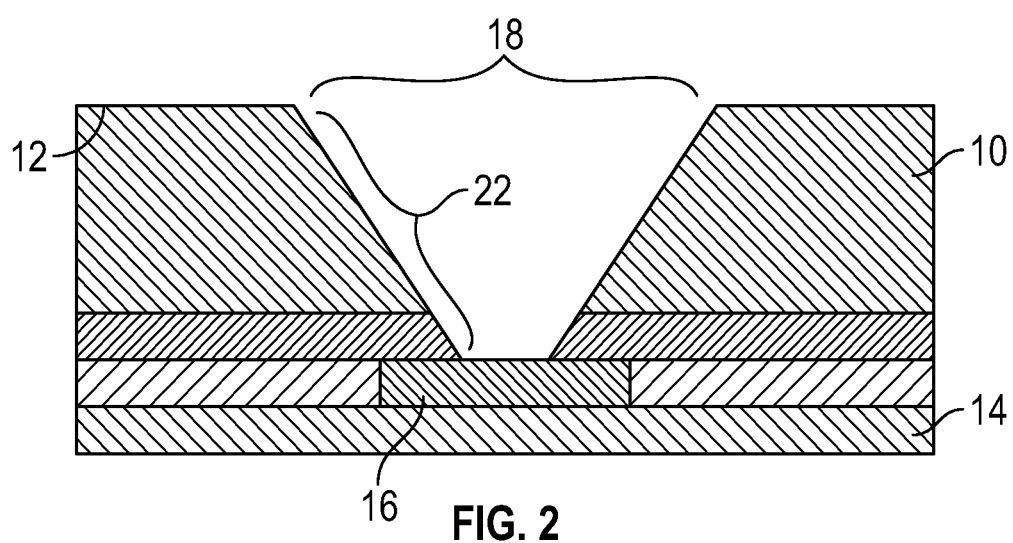
FIG. 2 illustrates the implementation of the semiconductor device, as shown in FIG. 1, after a via (via opening) is formed.

Referring to FIG. 2, the implementation of the semiconductor device, as shown in FIG. 1, is illustrated after a via is formed. As illustrated, a via (via opening) 18 is formed in the first side 12 of the semiconductor substrate 10, and extends from the first side 12 of the semiconductor substrate 10 to the surface of the pad 16. In other various implementations, some etching of the pad 16 could occur. However, in other implementations, the via 18 may not extend into the pad 16, particularly where the etch chemistry used to etch the opening for the via is selective to the material of the semiconductor substrate and not to the metal/metal alloy material of the pad. In various implementations, the via 18 may be a through-silicon via. In a preferred embodiment, as illustrated, a sidewall 22 of the via 18 may be angled less than 85 degrees from a line that is parallel with a plane formed by the first side 12 of the semiconductor substrate 10. In particular implementations, the angle may be between about 62 degrees to 63 degrees. The use of the slope/angle to the sidewall 22 of the via 18 enables the subsequent processing to take place.

Still referring to FIG. 2, in various implementations, the via 18 is may be etched using a Bosch deep reactive ion etching (DRIE) method where the semiconductor substrate is made of silicon, or it may be etched using another wet or dry etching technique compatible with the material of the semiconductor substrate. Where Bosch etching is used, the etch process may be operated to create a much more isotropic etching conditions for the etch than is generally used for DRIE processing. In a preferred embodiment, a width of the upper portion of the via opening 18 adjacent the surface of the substrate 10 may be greater than 200 microns. As illustrated, the pad 16 is coupled to the dielectric layer 14.

Figure 3:
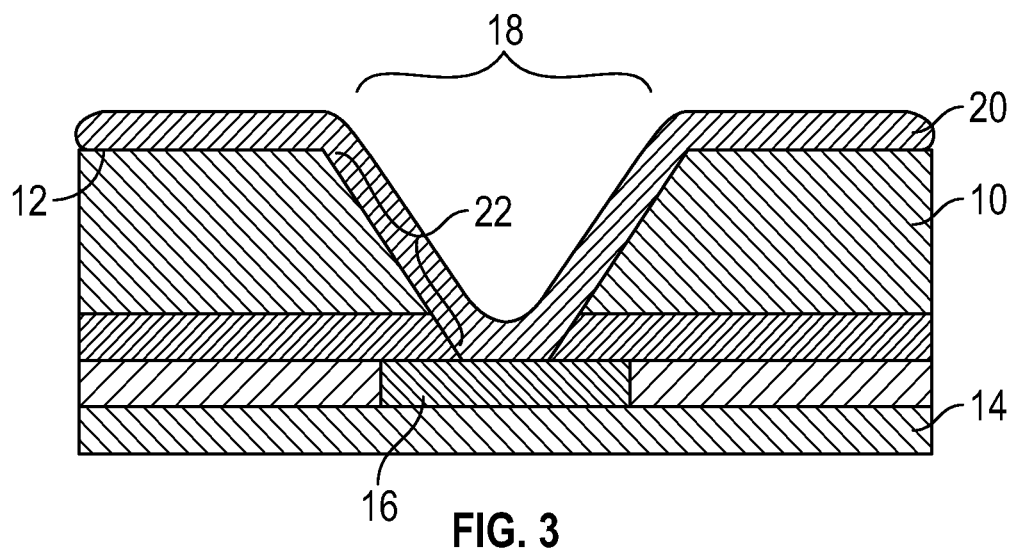
FIG. 3 illustrates the implementation of the semiconductor device, as shown in FIG. 2, after a polymer layer is formed on sidewalls of the via.

Referring to FIG. 3, the cross sectional view of the implementation of the semiconductor device, is illustrated in FIG. 2 after a polymer layer is formed on sidewalls of the via. As illustrated, the polymer layer 20 is formed along the entire sidewall 22 of the via 18 and the first side 12 of the semiconductor substrate 10. In various implementations, by non-limiting example, the polymer layer 20 may include an epoxy-based polymer, a polyimide polymer, a phenol polymer, an acrylic polymer, a novolak polymer, a benzocyclobutene (BCB) polymer, a polybenzoxazole (PBO) polymer, a polynorbornene polymer, or any other polymeric material. As illustrated, the polymer layer 20 is in direct contact with the pad 16. In various implementations, an additional oxide layer may be coupled between the polymer layer 20 and the sidewall 22 of the via 18. This is illustrated by FIG. 7, which illustrates a semiconductor device having essentially the same structure as the device of FIG. 6 with the only difference being that the semiconductor device of FIG. 7 includes an oxide layer 30 formed on the sidewalls of the via between the polymer layer 32 and the semiconductor substrate 34. In such implementations, the oxide layer may be deposited and then etched from the surface of the pad prior to the formation of the layer over the sidewalls of the via. In other various implementations, an oxide layer may not be used. As illustrated by FIG. 3, the pad 16 is coupled to the dielectric layer 14 and it is formed in an adjacent dielectric layer.

Figure 4:
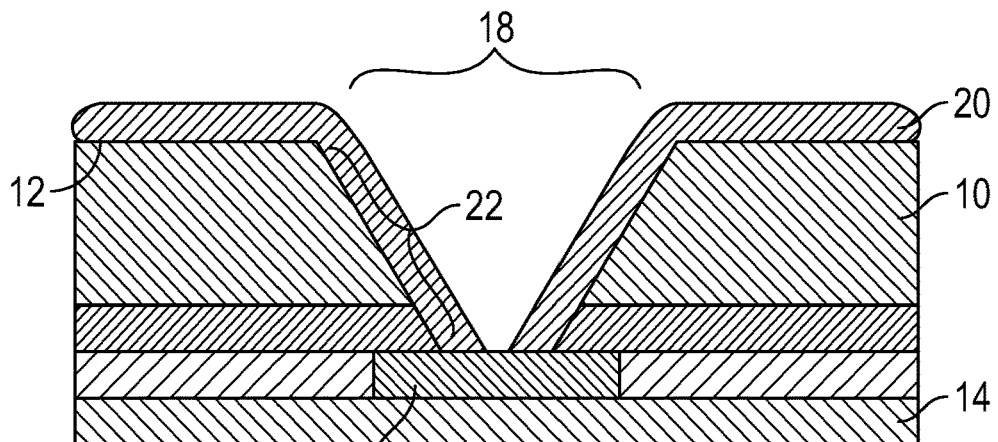
FIG. 4 illustrates the implementation of the semiconductor device, as shown in FIG. 3, after the polymer layer is exposed and developed.

Referring to FIG. 4, the implementation of the semiconductor device illustrated in FIG. 3 is illustrated after the polymer layer over the pad 16 is removed. As illustrated, the polymer layer 20 is removed so that the pad 16 is exposed. In various implementations, photolithography may be used to remove the polymer layer 20. In other various implementations, by non-limiting example, the etching may be performed using a plasma etching process with or without additional patterning steps. As illustrated, the polymer layer 20 remains present along the entire sidewall 22 of the via 18 and the first side 12 of the semiconductor substrate 10 following the removal of the polymer layer over the pad 16. In various implementations, the polymer layer 20 may be plasma etched to modify the surface to improve adhesion of the metal.

Figure 5:
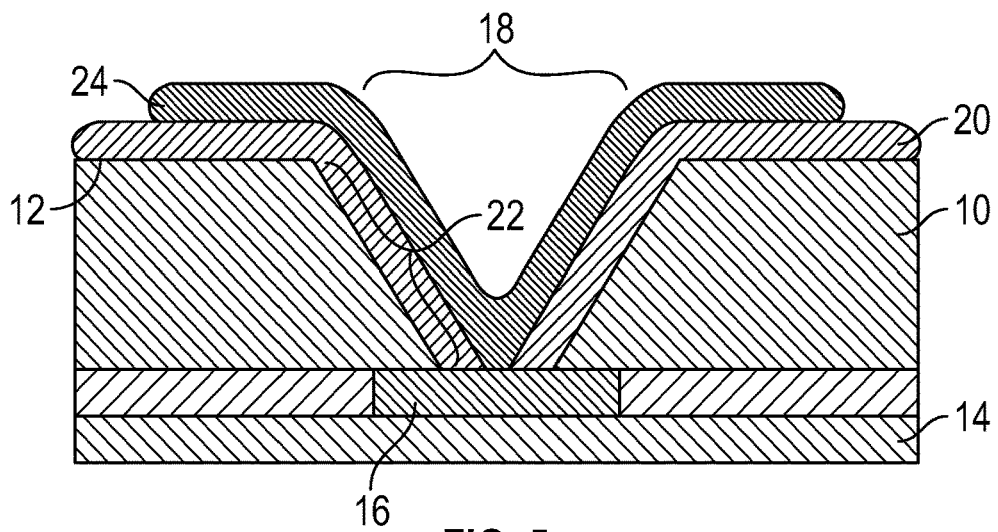
FIG. 5 illustrates the implementation of the semiconductor device, as shown in FIG. 4, after a metal layer is formed over the polymer layer.

Referring to FIG. 5, the implementation illustrated in FIG. 4 after a metal layer is formed over the polymer layer is illustrated. As illustrated, a metal layer 24 is deposited directly over the polymer layer 20. In various implementations, the metallization of the semiconductor substrate 10 may be accomplished by the use of photolithography patterning to define the regions where the metal will deposit. In some implementations, additional etching/ashing/stripping steps may be employed to remove photoresist or other remaining metal. In other various implementations, the metal layer 24 may be, by non-limiting example, titanium, titanium-tungsten, copper, aluminum, gold, tungsten, chromium, nickel, silicon, any combination thereof, or any other metal or alloy. In various implementations, an entirety of the metal layer 24 contacts the polymer layer 20. As illustrated, following deposition, the metal layer 24 is directly coupled with the pad 16. As illustrated, the metal layer 24 also conforms with the sidewall 22 of the via 18 and the first side 12 of the semiconductor substrate 10.

At this point, the metal layer 24 can be used to provide an electrical connection with the pad 16. Various electrical connectors may be used/formed to establish the connection with a substrate, die package, circuit board, or other motherboard to which the semiconductor device will be coupled, such as, by non-limiting example, balls, solder, solder balls, pillars, wire bonds, metal to metal bonding, or any other electrical connector type.

Figure 6:
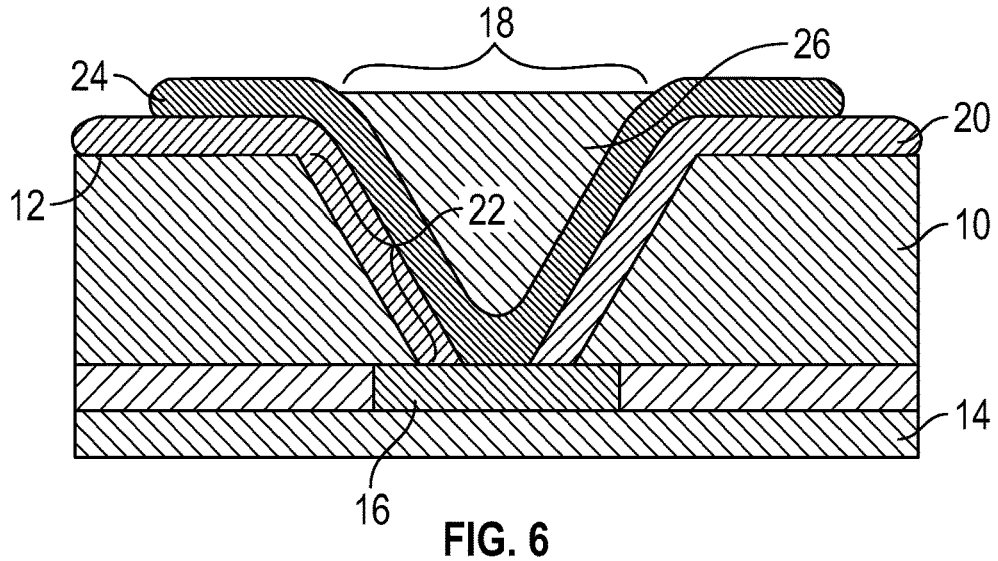
FIG. 6 illustrates the implementation of the semiconductor device, as shown in FIG. 5, after the via is filled.
Figure 7:
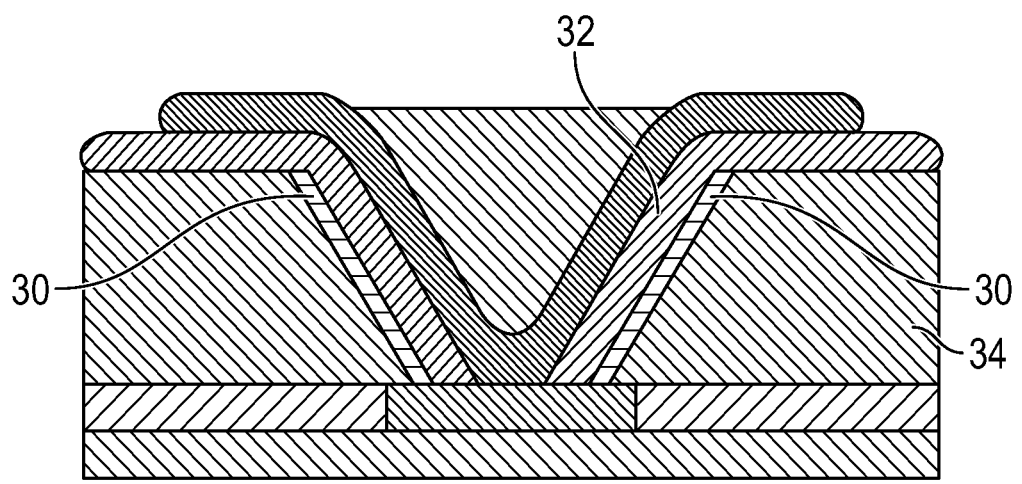
FIG. 7 illustrates an implementation of a semiconductor device including an oxide layer.

Referring to FIG. 6, the device illustrated in FIG. 5 is illustrated after an optional additional step of filling all or a portion of the via with a metal or other filler material, such as, by non-limiting example, a polymer or a resin. In a particular implementation, the metal layer 24 is a seed layer and the metal layer is used to electroplate or electrolessly plate additional metal material into the via (which may be any disclosed in this document). In other implementations, solder may be deposited into the via 18 to complete filling all or part of it with electrically conductive material. In such implementations, screen printing or squeegee application techniques may be employed to apply the solder in the form of a solder paste. In other implementations, the filling of the via may be accomplished through additional patterning and metal deposition techniques such as, by non-limiting example, sputtering or evaporation. In some implementations, particularly where the filling of the via takes place using tungsten, the metal deposition may take place through chemical vapor deposition followed by chemical mechanical polishing operations. In various implementations, the metal layer 24 may include/act as a diffusion barrier layer to prevent migration of the metals in the via 18 into the semiconductor substrate 10.

While in the drawings, a single via is illustrated, it will be understood that in the various processing implementations, many more vias may be formed simultaneously across a wafer, substrate, or die being processed. In various process implementations, while the illustrated process of forming via using slanted sidewalls may be being carried out, other vias may be simultaneously or subsequently be formed in the same layer which have sidewalls angled at greater than 85 degrees from a line that is parallel with a plane formed by the first side of the semiconductor substrate. A wide variety of possible combinations of via types and processing steps are possible using the principles disclosed in this document.

In places where the description above refers to particular implementations of vias for semiconductor devices and implementing components, sub-components, methods and sub-methods, it should be readily apparent that a number of modifications may be made without departing from the spirit thereof and that these implementations, implementing components, sub-components, methods and sub-methods may be applied to other vias for semiconductor devices.

What is claimed is:

1. A semiconductor device comprising:
   a semiconductor substrate comprising a first side, wherein the first side of the semiconductor substrate is opposite from and furthest from a second side of the semiconductor substrate, the semiconductor substrate comprising a pad;
   a via extending from the first side of the semiconductor substrate to the pad;
   a polymer layer coupled along an entire sidewall of the via, the polymer layer in direct contact with the pad; and
   a metal layer directly coupled over the polymer layer, such that the metal layer contacts an entire sidewall of the polymer layer within the via, and the metal layer directly couples with a surface of the pad facing the via;
   wherein the metal layer comprises a recess formed therein;
   wherein the sidewall of the via is angled less than 85 degrees from a line parallel with a plane formed by the first side of the semiconductor substrate; and
   wherein the sidewall of the via is continuously sloped from the first side of the semiconductor substrate to the pad.

2. The semiconductor device of claim 1, wherein the metal layer is a seed layer.

3. The semiconductor device of claim 2, wherein a second metal layer is electroplated on the seed layer.

4. The semiconductor device of claim 1, wherein a width of the via is greater than 200 microns.

5. The semiconductor device of claim 1, wherein the polymer layer comprises one of a polyimide, a polybenzoxazole (PBO), or a bisbenzocyclotene (BCB).

6. The semiconductor device of claim 1, further comprising an oxide layer coupled between the polymer layer and the sidewall of the via.

7. The semiconductor device of claim 1, wherein an entirety of the first side of the semiconductor substrate lies within a same plane.

8. The semiconductor device of claim 1, wherein the pad is formed in a dielectric layer.

9. The semiconductor device of claim 8, wherein the pad is coupled between the via and a second dielectric layer.

10. A semiconductor device comprising:
    a semiconductor substrate comprising a first side, wherein the first side of the semiconductor substrate is opposite from and furthest from a second side of the semiconductor substrate, the semiconductor substrate comprising a pad formed in a dielectric layer;
    a via extending from the first side of the semiconductor substrate to the pad;
    a polymer layer coupled along a sidewall of the via, the polymer layer in direct contact with the pad;
    a metal layer coupled over the polymer layer and directly coupled with a surface of the pad facing the via; and
    an oxide layer coupled between the polymer layer and the sidewall of the via;
    wherein the sidewall of the via is angled less than 85 degrees from a line parallel with a plane formed by the first side of the semiconductor substrate;
    wherein the sidewall of the via is continuously sloped from the first side of the substrate to the pad; and
    wherein an entirety of the first side of the substrate lies in a same plane.

11. The semiconductor device of claim 10, wherein an entirety of the metal layer contacts the polymer layer.

12. The semiconductor device of claim 10, wherein the metal layer is a seed layer.

13. The semiconductor device of claim 12, wherein a second metal layer is electroplated on the seed layer.

14. The semiconductor device of claim 10, wherein a width of the via is greater than 200 microns.

15. The semiconductor device of claim 10, wherein the polymer layer comprises one of a polyimide, a polybenzoxazole (PBO), or a bisbenzocyclotene (BCB).

16. The semiconductor device of claim 10, wherein the oxide layer is etched.

17. The semiconductor device of claim 10, wherein the pad is coupled between the via and a second dielectric layer.

18. A semiconductor device comprising:
    a semiconductor substrate comprising a first side, wherein the first side of the semiconductor substrate is opposite from and furthest from a second side of the semiconductor substrate, the semiconductor substrate comprising a pad formed in a dielectric layer;

a via extending from the first side of the semiconductor substrate to the pad;

a polymer layer coupled along an entire sidewall of the via, the polymer layer in direct contact with the pad;

an oxide layer coupled between the polymer layer and the sidewall of the via; and a metal layer directly coupled over the polymer layer, such that the metal layer contacts an entire sidewall of the polymer layer within the via, and the metal layer directly couples with a surface of the pad facing the via;

wherein the metal layer comprises a recess formed therein;

wherein the sidewall of the via is angled less than 85 degrees from a line parallel with a plane formed by the first side of the semiconductor substrate; and wherein the sidewall of the via is continuously sloped from the first side of the semiconductor substrate to the pad.

19. The semiconductor device of claim 18, wherein the oxide layer is etched.

20. The semiconductor device of claim 18, wherein an entirety of the first side of the semiconductor substrate lies within a same plane.

\* \* \* \* \*